United States Patent
Kokjohn

(10) Patent No.: US 6,910,203 B2
(45) Date of Patent: Jun. 21, 2005

(54) PHOTOMASK AND METHOD FOR QUALIFYING THE SAME WITH A PROTOTYPE SPECIFICATION

(75) Inventor: Craig W. Kokjohn, Danville, CA (US)

(73) Assignee: Toppan Photomasks, Inc., Round Rock, TX (US)

( * ) Notice: Subject to any disclaimer, the term of this patent is extended or adjusted under 35 U.S.C. 154(b) by 0 days.

(21) Appl. No.: 10/314,844

(22) Filed: Dec. 9, 2002

(65) Prior Publication Data

US 2003/0198873 A1 Oct. 23, 2003

Related U.S. Application Data

(60) Provisional application No. 60/339,370, filed on Dec. 10, 2001.

(51) Int. Cl.[7] .............................................. G06F 17/50
(52) U.S. Cl. .............................. 716/19; 716/20; 716/21
(58) Field of Search ............................... 716/19, 20, 21

(56) References Cited

U.S. PATENT DOCUMENTS

| | | | | |
|---|---|---|---|---|
| 4,131,472 A | * | 12/1978 | MacDonald et al. | 430/30 |
| 5,065,208 A | * | 11/1991 | Shah et al. | 257/587 |
| 5,663,891 A | * | 9/1997 | Bamji et al. | 716/2 |
| 5,827,625 A | * | 10/1998 | Lucas et al. | 430/5 |
| 6,064,484 A | * | 5/2000 | Kobayashi et al. | 356/390 |
| 6,175,953 B1 | * | 1/2001 | Scepanovic et al. | 716/21 |

OTHER PUBLICATIONS

PCT International Preliminary Examination Report for International Application No. PCT/US02/39593, 7 pages, Mailing Date Nov. 2, 2004.
PCT Written Opinion PCT/US02/39593, 6 pages, Mailing Mar. 25, 2004.
Bonn et al. "Balancing Mask and Lithography Costs", SEMI Semiconductor Equipment and materials International Industry Report at internet address http://www.semi.org/web/wsemi.nsf/webdocs/973470FE298559A388256A31006BAD0 . . . 5 Pages, May 2001.
International Search Report PCT/US02/39593, 6 pages, Mailed Sep. 8, 2003.

* cited by examiner

*Primary Examiner*—A. M. Thompson
*Assistant Examiner*—Brandon W. Bowers
(74) *Attorney, Agent, or Firm*—Baker Botts L.L.P.

(57) ABSTRACT

A photomask and method for qualifying the same with a prototype specification are disclosed. The method includes comparing a plurality of die sites formed in a patterned layer on a photomask with a prototype specification. If at least one of the die sites complies with the prototype specification, the photomask is selected for used in a semiconductor manufacturing process.

7 Claims, 2 Drawing Sheets

PHOTOMASK AND METHOD FOR QUALIFYING THE SAME WITH A PROTOTYPE SPECIFICATION

CROSS REFERENCE TO RELATED APPLICATION

This application claims priority from U.S. Provisional Patent Application Ser. No. 60/339,370, filed Dec. 10, 2001, and entitled "Photomask and Method for Manufacturing the Same with a Prototype Specification."

TECHNICAL FIELD OF THE INVENTION

The present invention relates in general to photolithography and, more particularly to a photomask and method for qualifying the same with a prototype specification.

BACKGROUND OF THE INVENTION

As semiconductor device manufacturers continue to produce smaller devices, the requirements for photomasks used in the fabrication of these devices continue to tighten. Photomasks, also known as reticles or masks, typically consist of substrates (e.g., high-purity quartz or glass) that have an absorber layer (e.g., chrome) formed on a substrate. The absorber layer includes a pattern representing a circuit image that may be transferred onto semiconductor wafers in a lithography system. As feature sizes of semiconductor devices decrease, the corresponding circuit images on the photomask also become smaller and more complex. Consequently, the quality of the mask has become one of the most crucial elements in establishing a robust and reliable semiconductor fabrication process.

Before fabricating production quality integrated circuits (ICs), semiconductor manufacturers typically test the circuit design by using a prototype photomask. The cost of manufacturing prototypes that include advanced designs (e.g., feature sizes with a dimension less than 0.18 microns) has become a concern to photomask manufacturers since the cost of manufacturing photomasks is rapidly increasing. One factor that effects the cost of manufacturing a prototype photomask is the cycle time needed to print an image of the IC in a resist layer of a photomask blank. Currently, multiple instances of an IC are placed on a single photomask and each instance must meet standards in a production specification associated with a specific manufacturing process. For example, if a photomask contains twenty die and only nineteen die meet the standards in the production specification, the entire photomask is rejected and the process for manufacturing the photomask design starts from the beginning.

The yield associated with the prototype photomasks may be increased by reducing the number of instances of the IC that are included on the photomask. In this example, the decrease in throughput caused by reducing the number of ICs formed on the photomask may be offset by the yield improvement and the cycle time gains in the mask manufacturing processes. All IC sites, however, must meet the standards in the production specifications and any photomasks that have at least one defective IC site are rejected.

SUMMARY OF THE INVENTION

In accordance with teachings of the present invention, disadvantages and problems associated with manufacturing a prototype photomask have been substantially reduced or eliminated. In a particular embodiment, a photomask is used in a semiconductor manufacturing process if at least one of a plurality of die sites in a patterned layer meets a prototype specification.

In accordance with one embodiment of the present invention, a method for qualifying a photomask with a prototype specification includes comparing a plurality of die sites formed in a patterned layer on a photomask. If at least one of the die sites complies with the prototype specification, the photomask is selected for use in a semiconductor manufacturing process.

In accordance with another embodiment of the present invention, a photomask includes a patterned layer formed on at least a portion of a substrate. The patterned layer includes one or more die sites. The photomask is used in a semiconductor manufacturing process if at least one of the die sites complies with a prototype specification.

In accordance with a further embodiment of the present invention, a photomask assembly includes a pellicle assembly formed in part by a pellicle frame and a pellicle film attached thereto. A photomask is coupled to the pellicle assembly opposite from the pellicle film. The photomask includes a patterned layer formed on at least a portion of a substrate and at least one die site formed in the patterned layer. The photomask is used in a semiconductor manufacturing process if at least one of the die sites complies with a prototype specification.

Important technical advantages of certain embodiments of the present invention include a prototype specification that optimizes yield in a photomask manufacturing process. One or more instances of a single die are placed on a photomask and critical features in the die sites are compared to the prototype specification. If at least one of the die sites on the photomask meets the requirements of the prototype specification, the photomask is acceptable for use in a semiconductor manufacturing process. The yield associated with the manufacturing process is improved since the photomask may be selected for use even if it includes a defective die site.

Another important technical advantage of certain embodiments of the present invention includes a prototype specification that reduces the number of die sites on a prototype photomask. The photomask may be qualified for used in a semiconductor manufacturing process if only one die site on the photomask meets the standards in the prototype specification. Therefore, the photomask may include fewer die sites, which decreases the time needed to manufacture the photomask because fewer patterns must be written on the photomask.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
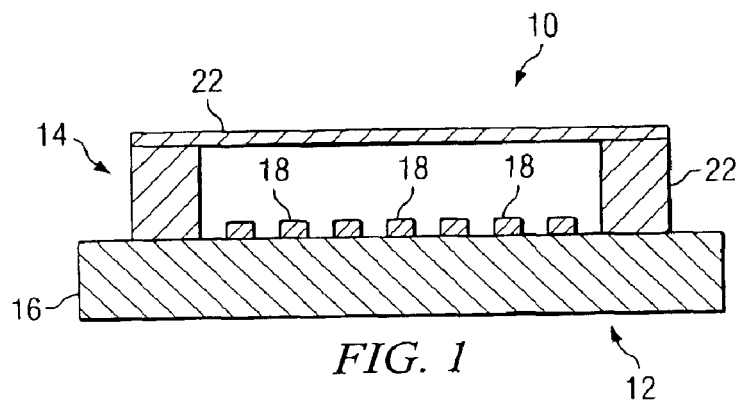
FIG. 1 illustrates a cross-sectional view of a photomask assembly manufactured with a prototype specification in accordance with teachings of the present invention.
Figure 2:
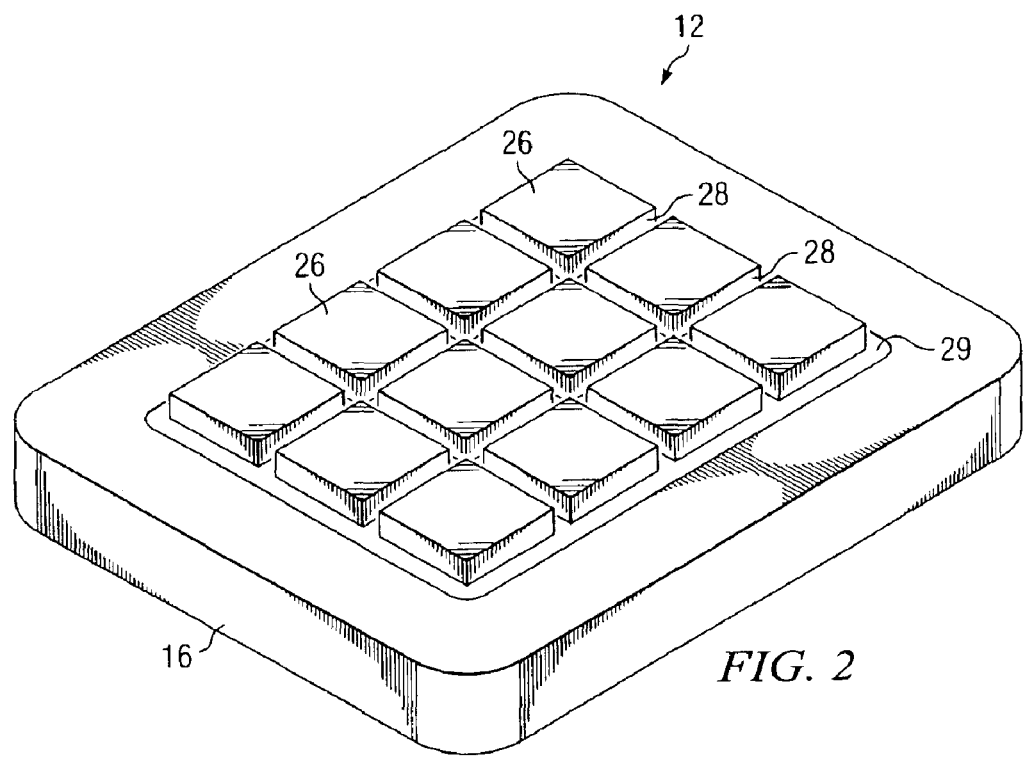
FIG. 2 illustrates a perspective view of a photomask including an array of die in accordance with teachings of the present invention.
Figure 3:
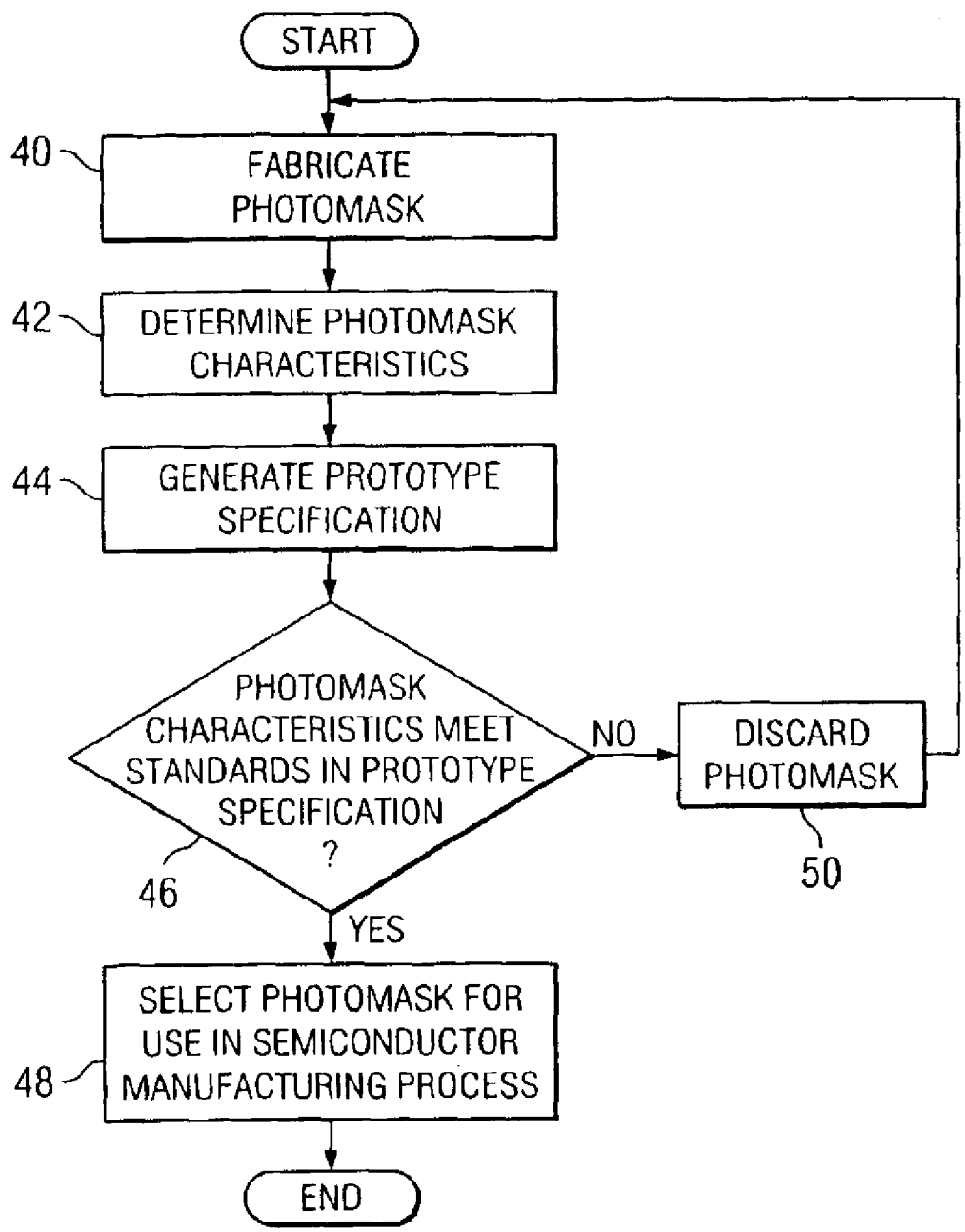
FIG. 3 illustrates a flow chart of a method for qualifying a photomask with a prototype specification.

Preferred embodiments of the present invention and their advantages are best understood by reference to FIGS. 1 through 3, where like numbers are used to indicate like and corresponding parts.

A photomask is a crucial component of a lithography system because it serves as the template that images a complex geometry, such as an integrated circuit (IC), on a wafer. Each IC may be formed by a combination of patterns that include multiple design features. As the dimensions of the design features decrease, the complexity of the manufacturing process used to make the photomask increases. In some cases, the photomask may include multiple instances of the IC. In a conventional process, if one of the instances does not meet the criteria in a production specification, the photomask is discarded and the manufacturing process for the photomask starts from the beginning. The present invention provides a prototype specification that enables a photomask to be used in a semiconductor manufacturing process if one or less than all of the instances of the IC meets standards included in the prototype specification.

FIG. 1 illustrates a cross-sectional view of photomask assembly 10 qualified with a prototype specification. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and/or extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and/or EUV ranges. In other embodiments, patterned layer 18 may any suitable number of material layers. The layers may be opaque, partially transmissive and/or transparent to the exposure wavelength of a lithography system.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is substantially transparent to wavelengths in the V, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by an energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer by a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In other embodiments, the laser lithography system uses lasers emitting light at wavelengths from approximately 150 nm to approximately 300 nm. Photomask 12 may be fabricated by developing exposed areas of the resist layer to create a pattern, etching the portions of patterned layer 18 not covered by resist, and removing the undeveloped resist to create patterned layer 18 over substrate 16.

Once patterned layer 18 has been formed on substrate 16, various critical features on photomask 12 are compared to standards in a specification. The specification may include standards that correspond to design rules associated with a semiconductor manufacturing process. For example, the specification may include a critical dimension measurement for a design rule used in a specific semiconductor manufacturing process, a registration tolerance for the design rule, a defect size on the photomask that may damage a device in the IC, or any other suitable standard that represents critical aspects of a semiconductor manufacturing process. In one embodiment, multiple instances of a circuit image, also known as a die site, may be formed in patterned layer 18. The die site on photomask 12 may represent the features in a specific layer (e.g., diffusion, polysilicon or metal) used to form an IC on a semiconductor wafer. In a conventional manufacturing process, each instance of the circuit image must meet standards in a production specification. Therefore, if one of the instances fails to comply with one or more of the standards in the production specification, the entire photomask fails and it is discarded.

A prototype specification, however, may only require that a certain number (e.g., between one and less than all) of the instances of the die sites meet the standards in the prototype specification. Similar to the production specification described above, the prototype specification may include criteria for critical dimensions, registration tolerances and defect sizes. The number of instances that must meet the prototype specification may be determined by either a photomask manufacturer or a semiconductor manufacturer. By allowing a photomask to be used in a semiconductor manufacturing process if less than all of the instances of the die site meet the standards in the prototype specification, the yield and cycle time for photomask 12 may be increased. Furthermore, the cost of manufacturing photomask 12 may decrease since fewer photomasks are rejected during the photomask manufacturing process.

FIG. 2 illustrates a perspective view of photomask 12 that includes an array of die 26 formed in patterned layer 18. Frame 29 surrounds the array and scribe lines 28 separate die 26. Photomask 12 may be fabricated by processing and generating one or more mask pattern files. In one embodiment, the patterns in frame 29 and in die 26 are included in a mask pattern file. In an another embodiment, the mask pattern file for photomask 12 may be split into a device pattern file that includes die 26 and a frame pattern file that includes scribe lines 28 and frame 29.

In the illustrated embodiment, the mask field of photomask 12 contains an array of die 26 that includes three columns and four rows. In an alternative embodiment, photomask 12 may include any suitable number of columns and rows as specified by a prototype specification. The mask field of photomask 12 may be the area of photomask 12 that may be imaged onto the surface of a wafer by a lithography system. The number of die 26 that can fit within the mask field for any given photomask depends on the dimensions of die 26. In other embodiments, photomask 12 may include any suitable number of columns and rows of die 26 that cover a portion of the mask field. Die 26 may be a microprocessor, microcontroller, microprocessor, digital signal processor (DSP), memory chip, such as a Static Random Access Memory (SRAM) or Dynamic Random Access (DRAM) chip, field programmable gate array (FPGA) or any other device that may be arrayed on photomask 12. In one embodiment, each instance of die 26 may include substantially identical features. In another embodiment, the array may include one or more different types of integrated circuits.

When a conventional production specification is used to characterize a photomask, each and every instance of the integrated circuit must individually meet the standards in the production specification. Therefore, if one instance of the circuit image does not meet the standards in the production specification, the photomask is discarded and the photomask manufacturing process is started from the beginning. In contrast, if a prototype specification is used to characterize photomask 12, one or more of the instances of die 26 may not meet the standards in the prototype specification but photomask 12 may still be used in a semiconductor manufacturing process. For example, as illustrated in FIG. 2, photomask 12 includes a three by four array of die 26. If the prototype specification is used in the photomask manufacturing process, one of twelve instances of die 26 may not meet the standards in the prototype specification. In another embodiment, eleven of the instances of die 26 may not meet the standards in the prototype specification. In further embodiments, at least one but less than the twelve instances of die 26 may meet the standards in the prototype specification. In the above examples, a semiconductor manufacturer and/or a photomask manufacturer may determine the number of die 26 that must meet the standards in the prototype specification in order for photomask 12 to be used in a specific semiconductor manufacturing process.

FIG. 3 illustrates a flow chart of a method for manufacturing photomask 12 with a prototype specification. In general, a photomask containing an array of die is fabricated using a conventional manufacturing process. Certain characteristics of each individual die are then compared to standards in a prototype specification. If one or more of the die on the photomask comply with the standards in the prototype specification, the photomask is used by a semiconductor manufacturer to project circuit images on to a semiconductor wafer.

At step 40, photomask 12 is fabricated using a conventional photomask manufacturing process. The photomask manufacturing process may include generating a mask pattern file from a circuit design file, exposing circuit features from the mask pattern file into a resist layer of a photomask blank, developing the exposed areas of the resist layer to uncover portions of an absorber layer, etching the portions of the absorber layer not covered by resist to form patterned layer 18 and removing the remaining resist layer. In one embodiment, photomask 12 may be a phase shift mask, an OPC mask or any suitable advanced design photomask used to form a critical layer of a semiconductor device on a wafer. The critical layer may be any layer of a semiconductor device that includes feature dimensions that may require advanced designs, such as phase shifting or optical proximity correction features, on the photomask.

At step 42, one or more characteristics associated with photomask 12 may be determined by using an inspection system and/or a metrology system. In one embodiment, photomask 12 may include multiple instances of die 26. The inspection and/or metrology systems may obtain characteristics for each instance of die 26. For example, a metrology system may be used to measure a critical dimension of a feature formed on photomask 12 and/or determine the registration, also known as overlay, associated with photomask 12. An inspection system may also be used to find and measure the size of any defects on photomask 12.

A prototype specification for a semiconductor manufacturing process may be generated at step 44. The prototype specification may include minimum and/or maximum standards for the semiconductor manufacturing process. In one embodiment, the prototype specification may include a critical dimension associated with a design rule associated with the semiconductor manufacturing process, a registration tolerance for the design rule and a defect size or defect density that is within the acceptable tolerances for the design rule. The prototype specification may be generated at any point in the photomask manufacturing process.

At step 46, the characteristics obtained for each instance of die 26 are compared to the standards in the prototype specification to determine if photomask 12 may be used in a semiconductor manufacturing process. In one embodiment, photomask 12 meets the standards in the prototype specification if at least one instance of die 26 is found to be acceptable to manufacture a semiconductor device. In another embodiment, photomask 12 meets the standards in the prototype specification if only one instance of die 26 is found to be unacceptable to manufacture the semiconductor device. In further embodiments, photomask 12 meets the standards in the prototype specification if between one and less than all instances of die 26 are acceptable to manufacture the semiconductor device.

If photomask 12 meets the standards in the prototype specification, photomask 12 may be used in a lithography system to project the image from patterned layer 18 onto a semiconductor wafer at step 48. Since photomask 12 may include one or more instances of die 26 that have defects or characteristics that did not meet the prototype specification and cannot be used to manufacture a semiconductor device, the semiconductor manufacturer may use a blading process in a lithography system to isolate the defective die. For example, in a stepper lithography system, the system images the pattern into a resist layer on the semiconductor wafer by printing the image from photomask 12 onto a portion of the semiconductor wafer and repeating the process until the surface of the wafer is covered with the images from photomask 12. In some lithography systems, only a portion of the image from photomask 12 may be projected onto the surface of the wafer. By only printing a portion of the image from photomask 12, the one or more defective instances of die 26 may be isolated and not printed onto the wafer. In another embodiment, all instances of die 26 may be printed onto the surface of the wafer, even if one instance is defective, and the semiconductor manufacturer can discard the defective devices.

If photomask 12 does not meet the standards in the prototype specification, photomask 12 is discarded at step 50. The photomask manufacturing process then returns to step 40 to begin manufacturing a new photomask with the same design. Photomask 12 may not meet the standards in the prototype specification if less than the required amount of die 26 are acceptable for manufacturing a semiconductor device.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method for qualifying a photomask using a prototype specification, comprising:

providing a photomask including a patterned layer having a plurality of die sites formed therein;

comparing each of the plurality of die sites formed in the patterned layer of the photomask to a prototype specification associated with a semiconductor manufacturing process to determine whether each die site complies with the prototype specification;

selecting the photomask for use in the semiconductor manufacturing process if between one and less than all of the plurality of die sites comply with the prototype specification; and during the semiconductor manufacturing process, transferring to a semiconductor wafer only portions of the patterned layer corresponding to die sites determined to comply with the prototype specification such that die sites determined not to comply with the prototype specification are isolated and not printed onto the wafer.

2. The method of claim 1, further comprising the prototype specification including at least one design rule associated with the semiconductor manufacturing process.

3. The method of claim 2, wherein the design rule comprises a critical dimension of a feature.

4. The method of claim 2, wherein the design rule comprises a registration tolerance associated with the photomask.

5. The method of claim 2, wherein the design rule comprises a defect size.

6. The method of claim 1, further comprising the photomask operable to project an image of a critical layer onto a wafer in a lithography system.

7. The method of claim 6, further comprising the critical layer including one or more features selected from the group consisting of a phase shift feature, and an optical proximity correction (OPC) feature.

* * * * *